(12) United States Patent
Nakamura

(10) Patent No.: US 7,459,777 B2
(45) Date of Patent: Dec. 2, 2008

(54) SEMICONDUCTOR PACKAGE CONTAINING MULTI-LAYERED SEMICONDUCTOR CHIPS

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 10 days.

(21) Appl. No.: 11/604,294

(22) Filed: Nov. 27, 2006

(65) Prior Publication Data

US 2007/0216001 A1 Sep. 20, 2007

(30) Foreign Application Priority Data

Mar. 1, 2006 (JP) .............................. 2006-055075

(51) Int. Cl.
*H01L 23/48* (2006.01)
*H01L 23/04* (2006.01)

(52) U.S. Cl. .............................. 257/686; 257/E23.011; 257/E25.013; 257/E23.178; 257/777; 257/723; 257/690; 257/774; 257/773; 257/778

(58) Field of Classification Search ................ 257/686, 257/E23.011, E25.013, E23.178, E21.705, 257/E21.597, 778, 734, 738, 680, 685, 723, 257/777, 724, 728, 698, 774, 773, 784, E21.511, 257/621

See application file for complete search history.

(56) References Cited

U.S. PATENT DOCUMENTS

| 5,907,178 | A | * | 5/1999 | Baker et al. ................. 257/433 |
| 6,355,501 | B1 | * | 3/2002 | Fung et al. .................. 438/107 |
| 7,259,454 | B2 | * | 8/2007 | Tanida et al. ................ 257/698 |
| 2005/0212126 | A1 | * | 9/2005 | Sunohara .................... 257/730 |
| 2005/0276299 | A1 | * | 12/2005 | Kondo ..................... 372/50.23 |
| 2006/0267206 | A1 | * | 11/2006 | Tanida et al. ................ 257/773 |

FOREIGN PATENT DOCUMENTS

JP 2005-044861 2/2005

* cited by examiner

*Primary Examiner*—Alexander O Williams
(74) *Attorney, Agent, or Firm*—Rabin & Berdo, PC

(57) ABSTRACT

According to this invention, a semiconductor package includes: a plurality of semiconductor chips, each having through electrodes; and a semiconductor interposer, on which the plurality of semiconductor chips are mounted. Each of the semiconductor chips includes: a semiconductor substrate; a wiring layer formed on the semiconductor substrate; an opaque resin layer sealing the wiring layer and a side surface of the semiconductor chip; and conductive bumps to be connected to the through electrodes.

11 Claims, 11 Drawing Sheets

US 7,459,777 B2

SEMICONDUCTOR PACKAGE CONTAINING MULTI-LAYERED SEMICONDUCTOR CHIPS

CROSS REFERENCE TO RELATED APPLICATION

This application claims the priority of Application No. 2006-55075, filed on Mar. 1, 2006 in Japan, the subject matter of which is incorporated herein by reference.

TECHNICAL FIELD OF THE INVENTION

This invention relates to a semiconductor package containing multi-layered semiconductor chips. In particular, this invention relates to a semiconductor package, in which semiconductor chips having through electrodes are mounted on a semiconductor interposer.

BACKGROUND OF THE INVENTION

In recent years, a system-in-package technology has been an object of public attention. Such a system-in-package technology provides a shorter period of time for fabricating a high performance system, in which a plurality of semiconductor chips, containing a semiconductor integrated circuit, is mounted in a package at a high density. It has been demanded that a system-in-package contains a plurality of semiconductor chips mounted in a three dimension manner to miniaturize the size significantly. In order to respond to such a demand, an advanced semiconductor package has been introduced, in which a plurality of semiconductor chips are mounted on a special purpose semiconductor chip, called "semiconductor interposer". Such a semiconductor interposer includes through electrodes therein.

According to a conventional package structure using semiconductor interposers, electrical circuits formed in semiconductor chips may have malfunction due to an undesired light comes into the semiconductor chips. Such a problem of malfunction is remarkable to memory chips, which include charge-storage layers being influenced easily by lights.

In order to prevent such a problem, Japanese Patent Publication No. 2005-44861A (Patent Related Publication 1) proposed an invention, in which a three-dimensionally mounted substrate includes a shield layer made of metal to shield undesired lights except light signals to be come into integrated circuits.

[Patent Related Publication 1] JP Publication No. 2005-44861A

However, according to the invention described in the Patent Related Publication 1, it is difficult to shield lights come from a side of the semiconductor package in a horizontal direction. When a plurality of semiconductor chips are layered or piled up, a thickness of the semiconductor package is increased. As a result, lights would come more easily in horizontal directions into the semiconductor package as compared to a semiconductor package containing a single semiconductor chip.

OBJECTS OF THE INVENTION

Accordingly, a first object of this invention is to provide a semiconductor package which can efficiently shield lights come laterally (in a horizontal direction) into semiconductor chips, mounted in the package.

Additional objects, advantages and novel features of this invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to this invention, a semiconductor package includes: a plurality of semiconductor chips, each having through electrodes; and a semiconductor interposer, on which the plurality of semiconductor chips are mounted. Each of the plurality of semiconductor chips comprises: a semiconductor substrate; a wiring layer formed on the semiconductor substrate; an opaque resin layer sealing the wiring layer and a side surface of the semiconductor chip; and conductive bumps to be connected to the through electrodes.

Here, function of semiconductor chips, having through electrodes, may be a variety kinds including memory or storage (RAM) function. The "side surface of semiconductor chip" is not only all four sides, but also some specific sides located near a circuit influenced easily by lights. The "conductive bumps" may be metal bumps. The "opaque resin layer" has enough opacity to shield a light, providing harmful effects to a circuit in the semiconductor chips. For example, an opaque resin may be formed adding a predetermined amount of carbon in a resin. The light transmittance of the opaque resin layer is preferably less than 20%.

According to the above-described invention, lights come into side surfaces of semiconductor chips can be shield effectively, and therefore, malfunction of the semiconductor chips can be prevented. Especially, this invention is effective or useful to a semiconductor package having a multi-layered structure of semiconductor chips, in which lights easily come in a horizontal direction.

In addition, it could be prevented that semiconductor chips are partially broken due to external stress or mechanical vibration and broken pieces of semiconductor chips come into spaces or rooms between a mount board and device terminals.

The semiconductor substrate may be shaped to have a beveling portion at a corner to surround the substrate, and the opaque resin layer is formed on a surface of the beveling portion. When an opaque resin layer is formed on a surface of a beveling portion of a semiconductor substrate, a path of an incident light entered from a side surface of the semiconductor substrate to a circuit element, formed on an upper surface of the semiconductor substrate, becomes longer.

The opaque resin layer may be formed to have a uniform thickness at a side surface of the semiconductor substrate entirely. In this case, a side surface of a semiconductor substrate could be covered completely, and therefore, shielding effectiveness could be improved against an incident light.

Especially, this invention is effective or suitable to a semiconductor package having memory chips, including charge-storage layers which are influenced easily by lights.

According to another aspect of this invention, a method for fabricating a semiconductor package, comprising:

providing a semiconductor wafer;

forming semiconductor chips on the semiconductor wafer, each of the semiconductor chips having a wiring layer, through electrodes and conductive bumps;

forming V-shape grooves at boundary of the semiconductor chips;

forming an opaque resin layer on a surface of the semiconductor wafer and in the V-shape grooves;

dicing the semiconductor wafer along the V-shape grooves to form individual semiconductor chips; and mounting the semiconductor chips on a semiconductor interposer.

According to still another aspect of this invention, a method for fabricating a semiconductor package, comprising:

providing a semiconductor wafer;

forming semiconductor chips on the semiconductor wafer, each of the semiconductor chips having a wiring layer, through electrodes and conductive bumps;

forming grooves at boundary of the semiconductor chips, each groove having a cross-section taken in a horizontal plane that is uniform in a depth-direction;

forming an opaque resin layer on a surface of the semiconductor wafer and in the grooves;

grinding the semiconductor wafer from its bottom surface until bottom surfaces of the semiconductor chips are exposed or slightly earlier;

dicing the semiconductor wafer along the grooves to form individual semiconductor chips, each having a light shield of the opaque resin at a side surface with a uniform thickness; and mounting the semiconductor chips on a semiconductor interposer.

In this case, preferably the grooves are U-shape or rectangle, in a cross section taken on a vertical plane. When the semiconductor chip has a flat side surface, dicing plane in a vertical direction is preferably parallel to the side surface to uniform the thickness of the opaque resin layer.

According to the above described method, many steps of fabrication process can be carried out to a wafer state of semiconductor chips, therefore, workability and process efficiency is high.

According to further aspect of this invention, a method for fabricating a semiconductor package, comprising:

providing a plurality of semiconductor chips;

locating the semiconductor chips to have a predetermined space between adjacent chips;

forming an opaque resin layer on surfaces of the semiconductor chips and to fill the spaces;

dicing the semiconductor wafer along the spaces, filled with the opaque resin layer, to form individual semiconductor chips, each having a light shield of the opaque resin at a side surface; and mounting the semiconductor chips on a semiconductor interposer.

According to the above described methods for fabricating a semiconductor package, defective semiconductor chips can be removed before packaging, therefore, product reliability and yield rate become high.

Figure 1A:
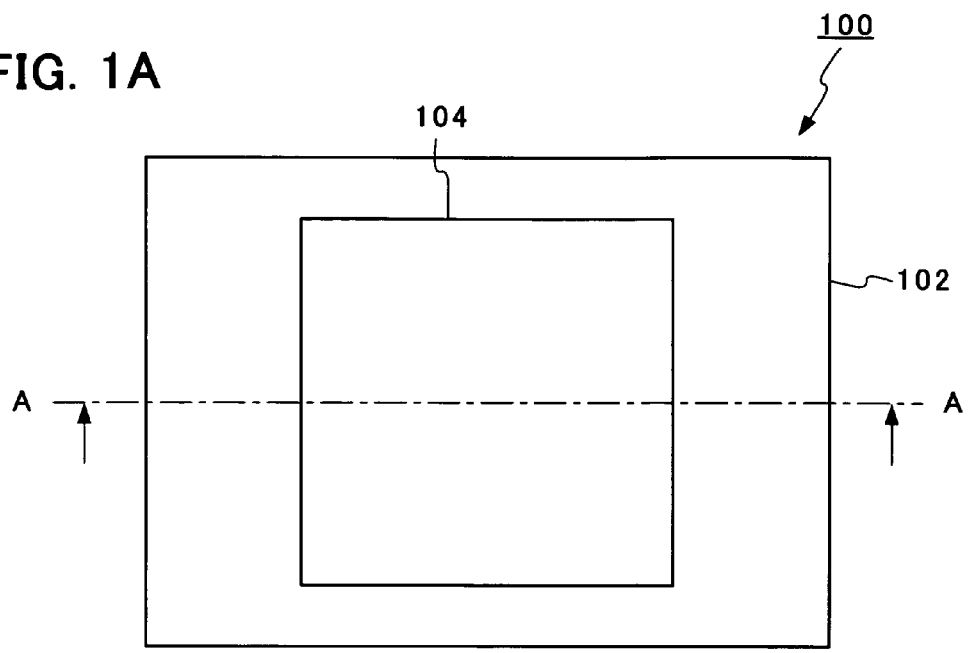
FIG. 1A is a plane view illustrating a semiconductor package, viewed from a semiconductor chip side, according to a first preferred embodiment of this invention.

DESCRIPTION OF THE REFERENCE NUMERALS 100, 200, 300, 400: Semiconductor Package
102, 202, 302: Semiconductor Interposer
104, 204: Semiconductor Layered Structure
104a, 204a: Semiconductor Chip
110, 210: Semiconductor Substrate
112, 212: Wiring Layer
114, 214: Through Electrode
118, 218: Opaque Resin Layer
120: Beveling (tapered or slant) Portion
124: V-shape Groove
240: U-shape Groove
310: Mother Board
312: Hollow (depressed, cavity) Portion

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of this inventions. The following detailed description is, therefore, not to be taken in a limiting sense, and scope of this invention is defined only by the appended claims.

Figure 1B:
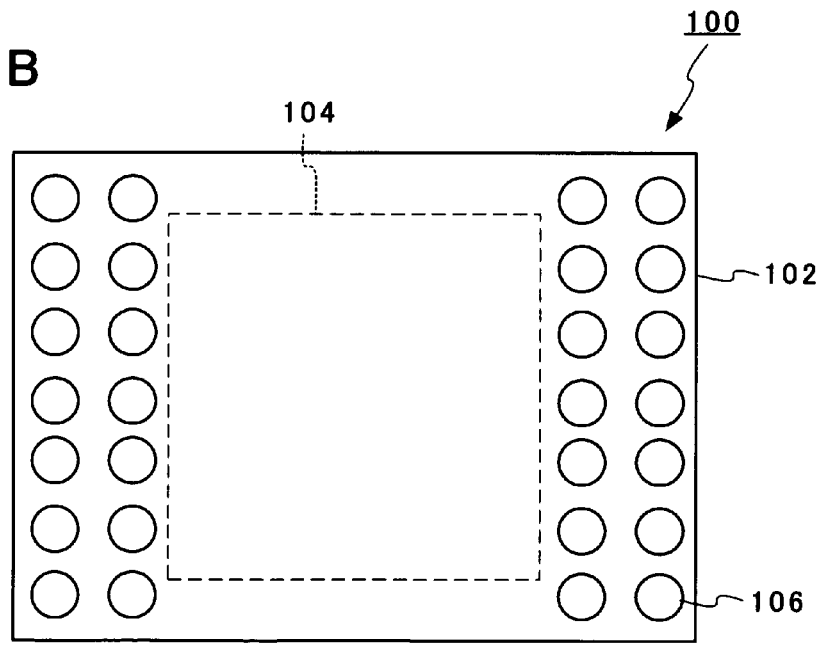
FIG. 1B is a plane view (bottom view) illustrating a semiconductor package, viewed from a semiconductor interposer side, according to the first preferred embodiment of this invention.
Figure 2A:
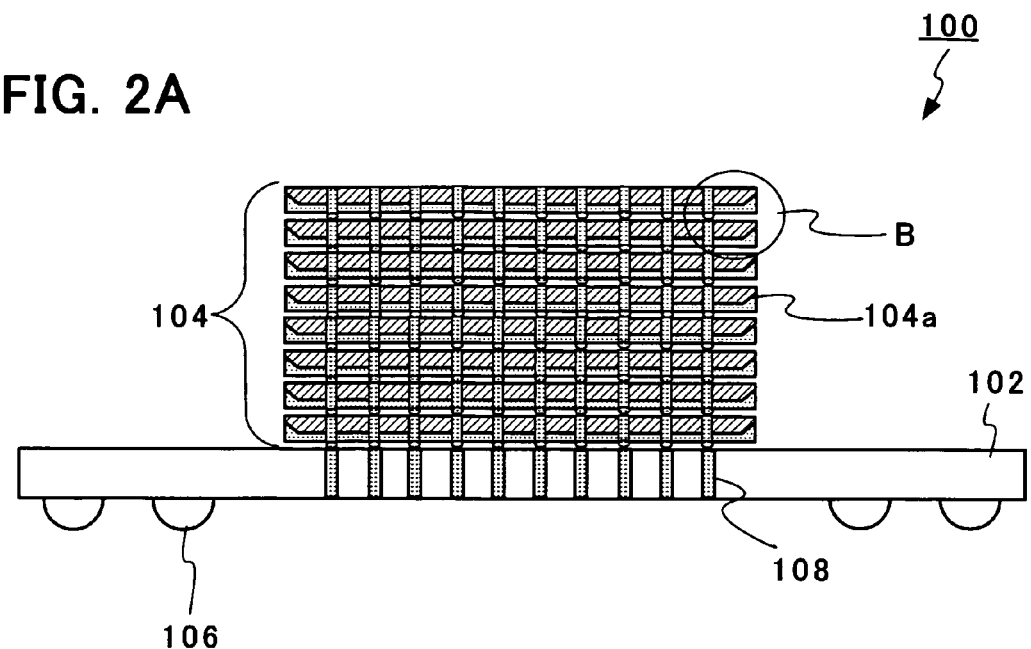
FIG. 2A is a cross-sectional view taken on line A-A in FIG. 1A.
Figure 2B:
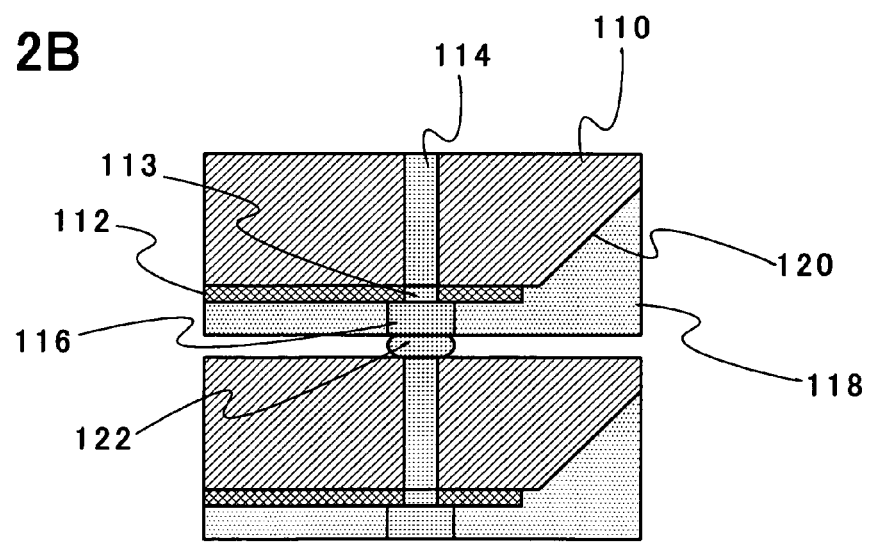
FIG. 2B is an enlarged cross-sectional view of region "B" in FIG. 2A.

This invention is now described with preferred embodiments as follows: FIG. 1A is a plane view illustrating a semiconductor package, viewed from a semiconductor chip side, according to a first preferred embodiment of this invention. FIG. 1B is a plane view (bottom view) illustrating a semiconductor package, viewed from a semiconductor interposer side, according to the first preferred embodiment of this invention. FIG. 2A is a cross-sectional view taken on line A-A in FIG. 1A. FIG. 2B is an enlarged cross-sectional view of region "B" in FIG. 2A. A semiconductor package (apparatus) 100 includes a semiconductor chip used as a mount chip, hereinafter called "semiconductor interposer 102"; a multi-layered semiconductor chip structure 104 mounted on the semiconductor interposer 102; a plurality of solder terminals 106 provided on a rear or bottom surface of the semiconductor interposer 102.

The multi-layered semiconductor chip structure 104 includes a plurality of semiconductor chips 104a, for example, eight of semiconductor chips, layered (piled up one on another) on the semiconductor interposer 102. The semiconductor interposer 102 is provided with a plurality of through electrodes 108, arranged to be face or opposing to through electrodes of the semiconductor chip 104a layered at the bottom. The number of layers of the semiconductor chips 104 is not limited by eight, but could be four, twelve and others.

As shown in FIG. 2B, each of the semiconductor chips 104a includes a semiconductor substrate 110, a wiring layer 112 formed on the semiconductor substrate 110, electrodes 113 formed on the semiconductor substrate 110 and metal bumps (projections) 116 formed to be connected to the electrodes 113. The metal bumps 116 may be made of copper (Cu). Through electrodes 114 are formed inside the semiconductor substrate 110 so that the through electrodes 114 are electrically connected to the metal bumps 116 through the electrodes 113. Adjacent two semiconductor chips 104a (an upper and a lower) are electrically connected to each other through metal solder 122. Although, according to this embodiment, every semiconductor chip 104a has the same structure, different structures of semiconductor chips may be used. The semiconductor chip 104a may be a functional chip, such as a large-capacity memory chip, and so on.

In each of the semiconductor chips 104a, a beveling (cut off corner) 120 is formed along a peripheral corner of the semiconductor substrate 110. An opaque resin layer 118 is formed to cover a surface (lower surface in FIG. 2) of the semiconductor chip 104a including the beveling 120. The opaque resin layer 118 may be made of epoxy resin including carbon. The opaque resin layer 118 is formed so as to expose surfaces of the metal bumps 116 and to secure electrical connection to the metal solders 122. An opaque resin may be also filled in a space between the adjacent semiconductor chips 104a.

Figure 3A:
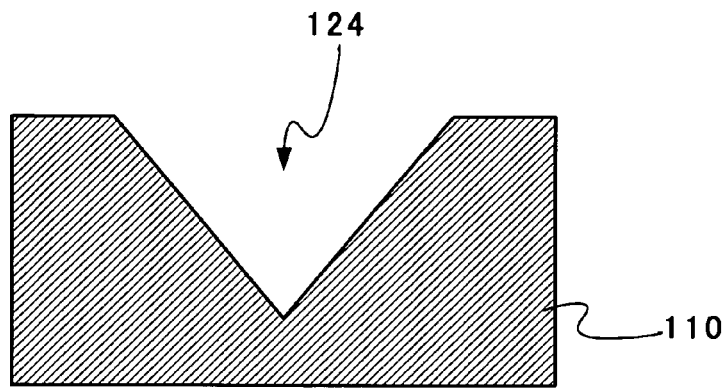
FIGS. 3A-3C are cross-sectional views showing a part of fabrication process of a semiconductor package according to the first preferred embodiment of this invention.
Figure 3B:
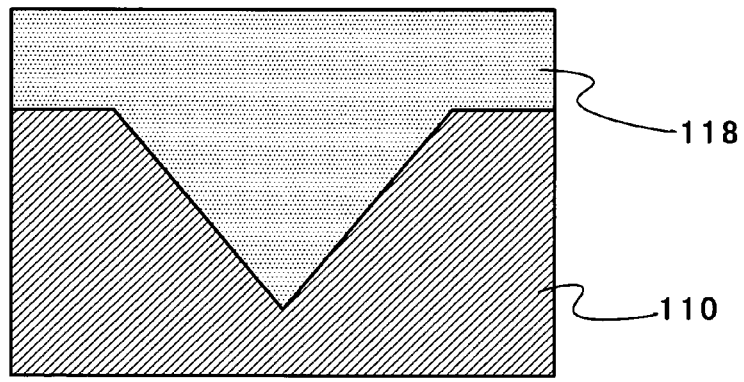
Figure 3C:
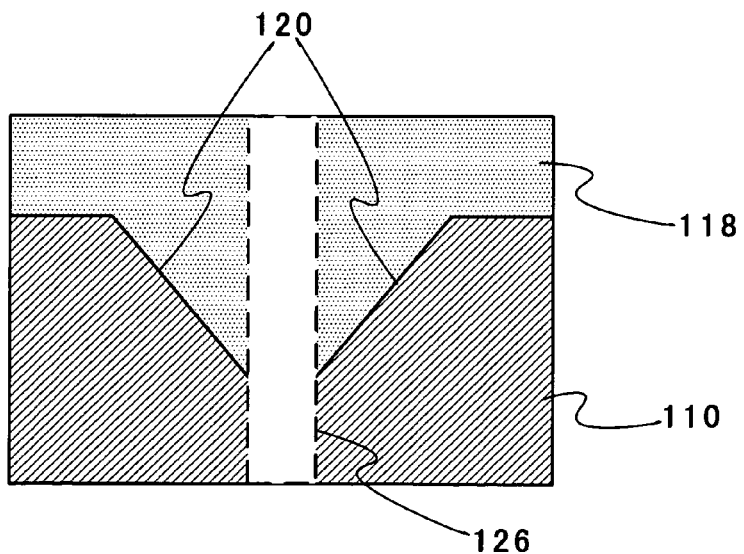

FIGS. 3A-3C are cross-sectional views showing a part of fabrication process of the semiconductor package 100 according to the first preferred embodiment of this invention. Here, the fabrication process is focused on a side surface of each semiconductor chip 104a. As shown in FIG. 3A, a wafer state of semiconductor substrate 110 having a wiring layer 112 is prepared. A V-shape groove 124 is formed along a dicing line on a surface of the semiconductor substrate 110, on which the wiring layer 112 is formed. Next, as shown in FIG. 3B, an opaque resin layer 118 is formed to cover the semiconductor substrate 110 entirely.

After that, as shown in FIG. 3C, the semiconductor substrate 110 is diced along the dicing line. A width of such a dicing (126) is slightly narrower than the upper most width of the V-shape groove 124. The semiconductor substrate 110 is divided into a plurality of individual substrates and each semiconductor chip 104 has a side surface having beveling (tapered portion) 120. The opaque resin layer 118 is remained on a surface of the beveling 120. After that, plural semiconductor chips 104a are layered and mounted on a semiconductor interposer 102. Thus fabricated semiconductor package 100, in a state shown in FIG. 2A, is now mounted on a mount board, such as a mother board, using solder terminals 106.

Figure 4A:
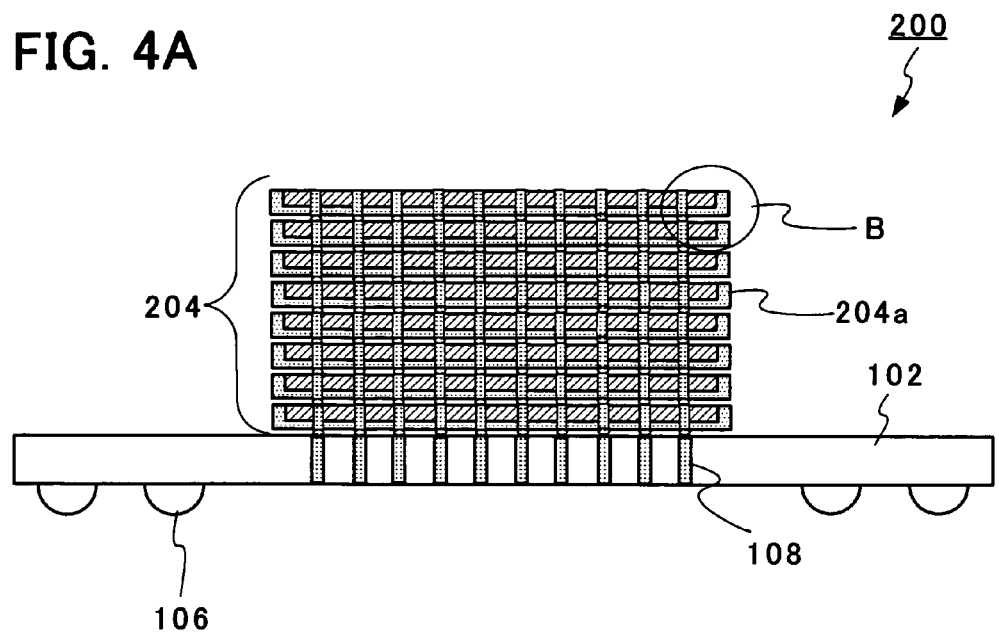
FIG. 4A is a cross-sectional view illustrating a semiconductor package according to a second preferred embodiment of this invention.
Figure 4B:
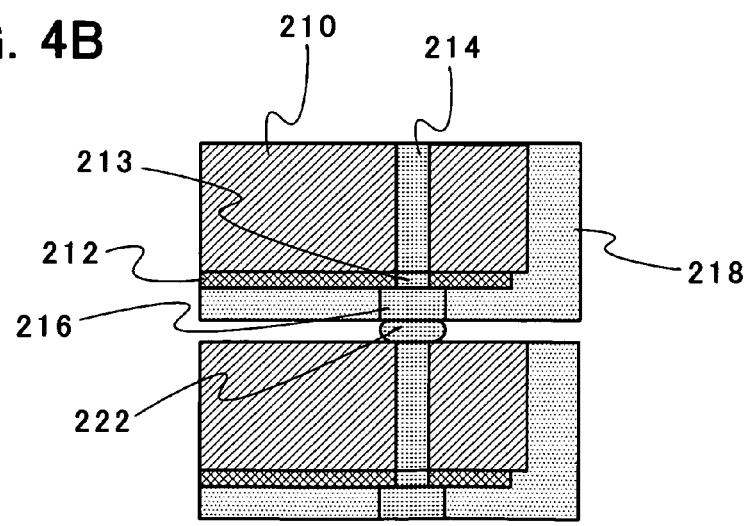
FIG. 4B is an enlarged cross-sectional view of region "B" in FIG. 4A.

FIG. 4A is a cross-sectional view illustrating a semiconductor package 200 according to a second preferred embodiment of this invention; and FIG. 4B is an enlarged cross-sectional view of region "B" in FIG. 4A. In FIGS. 4A, 4B, 5A-5D and 6A-6F, the same or corresponding components to those in the first preferred embodiment are represented by the same reference numerals, and the same description is not repeated. The difference from the first preferred embodiment is a shape of an opaque resin layer. In other words, the difference between the first preferred embodiment and the second preferred embodiment is areas where an opaque resin layer is formed.

A semiconductor package (apparatus) 200 includes a semiconductor interposer 102; a multi-layered semiconductor chip structure 204 mounted on the semiconductor interposer 102; a plurality of solder terminals 106 provided on a rear or bottom surface of the semiconductor interposer 102.

The multi-layered semiconductor chip structure 204 includes a plurality of semiconductor chips 204a, for example, eight of semiconductor chips, layered (piled up one on another) on the semiconductor interposer 102. The semiconductor interposer 102 is provided with a plurality of through electrodes 108, arranged to be face or opposing to through electrodes of the semiconductor chip 204a layered at the bottom.

As shown in FIG. 4B, each of the semiconductor chips 204a includes a semiconductor substrate 210, a wiring layer 212 formed on the semiconductor substrate 210, electrodes 213 formed on the semiconductor substrate 210 and metal bumps (projections) 216 formed to be connected to the electrodes 213. The metal bumps 216 may be made of copper (Cu). Through electrodes 214 are formed inside the semiconductor substrate 210 so that the through electrodes 214 are electrically connected to the metal bumps 216 through the electrodes 213. Adjacent two semiconductor chips 204a (an upper and a lower) are electrically connected to each other through metal solder 222. Although, according to this embodiment, every semiconductor chip 204a has the same structure, different structures of semiconductor chips may be used. The semiconductor chip 204a may be a functional chip, such as a large-capacity memory chip, and so on.

In each of the semiconductor chips 204a, an upper surface, where the wiring layer 212 is formed, and a side surface are entirely and completely covered with an opaque resin layer 218. The opaque resin layer 218 may be made of epoxy resin including carbon. The opaque resin layer 218 is formed so as to expose surfaces of the metal bumps 216 and to secure electrical connection to the metal solders 222. An opaque resin may be also filled in a space between the adjacent semiconductor chips 204a. The opaque resin layer 218 is formed at a side surface of the semiconductor substrate to have a uniform (equal) thickness entirely.

Figure 5A:
FIGS. 5A-5D are cross-sectional views showing a part of fabrication process of a semiconductor package according to the second preferred embodiment of this invention.

FIGS. 5A-5D are cross-sectional views showing a part of fabrication process of the semiconductor package 200 according to the second preferred embodiment of this invention. For easy understanding of the present embodiment, FIGS. 5A-5D do not show all of components and layers including a wiring layer 212 formed on a semiconductor substrate 210. As shown in FIG. 5A, a plurality of semiconductor chips 210 are arranged to have a space or gap 224 between every two adjacent (next) semiconductor chips in a horizontal plane. In this process, only semiconductor chips having good characteristics may be selected for use.

Figure 5B:
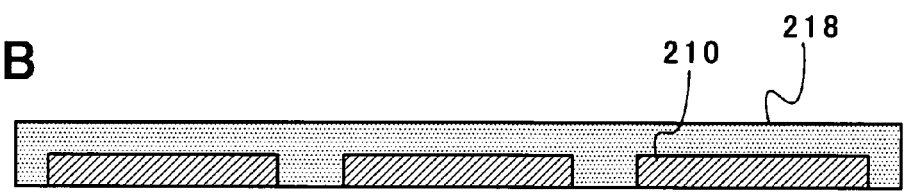
Figure 5C:
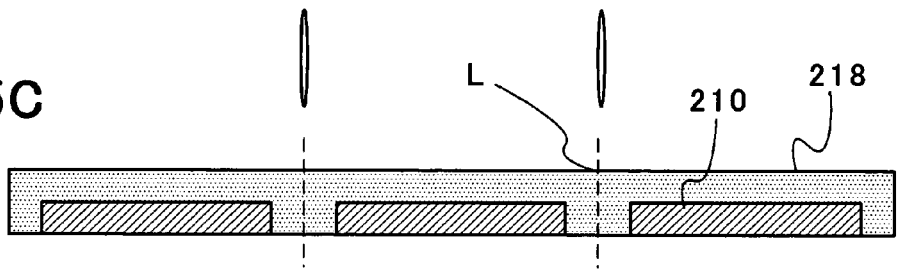
Figure 5D:
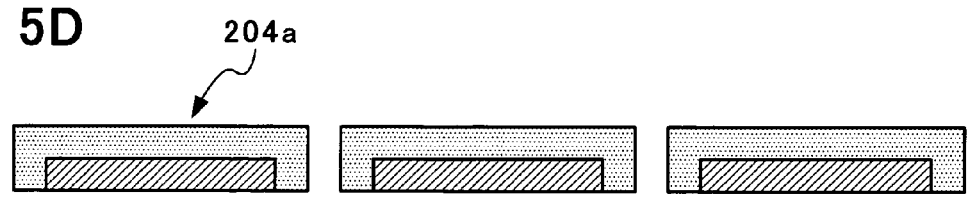

Next, as shown in FIG. 5B, an opaque resin layer 218 is formed over the semiconductor chips 210 so as to be filled in the every space 224. Next, as shown in FIG. 5C, the opaque resin layer 218 is cut off along dicing lines "L" on the spaces 224 to form individual semiconductor chips 204a, covered with an opaque resin, as shown in FIG. 5D. After that, thus fabricated semiconductor chips 204a are mounted on a semiconductor interposer 102 to complete a semiconductor package 200, shown in FIG. 4A. The semiconductor package 200 is mounted on a mount board, for example, a mother board using solder terminals 106.

FIGS. 6A-6F are cross-sectional views showing a part of another fabrication process of a semiconductor package 200 according to the second preferred embodiment of this invention. For easy understanding of the present embodiment, FIGS. 6A-6D do not show all of components and layers including a wiring layer 212 formed on a semiconductor substrate 210.

Figure 6A:
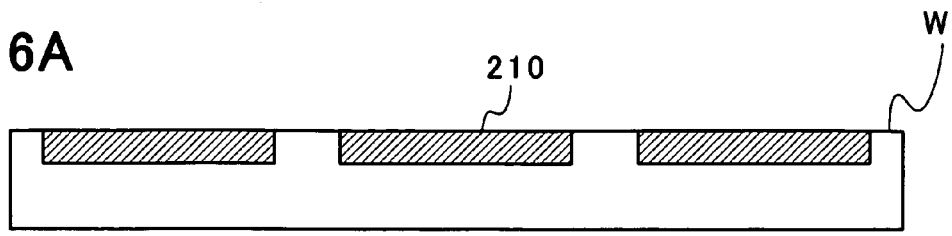
FIGS. 6A-6F are cross-sectional views showing a part of another fabrication process of a semiconductor package according to the second preferred embodiment of this invention.
Figure 6B:
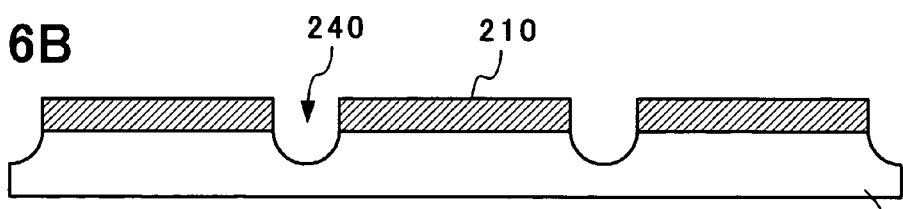
Figure 6C:
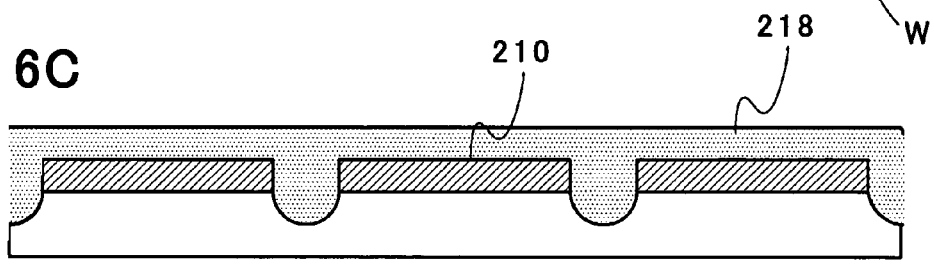

First, as shown in FIG. 6A, a plurality of semiconductor chips 210 is formed on a semiconductor wafer "W" to have a predetermined interval or apace for dicing. Next as shown in FIG. 6B, grooves 240 are formed along with dicing lines. The grooves 240 have the almost identical shape of cross section. The grooves 240 are formed from a surface of the semiconductor wafer, where a wiring layer 212 is formed. Each of the grooves 240 is formed to have a depth that is larger than a thickness of the semiconductor chip 210. According to FIGS. 6B and 6C, although the grooves 240 are shaped to be U-shape, the shape of the grooves 240 is not limited by U-shape. All of the grooves 240 should be shaped to have the identical shape of cross section at least in a range of depth corresponding to side surfaces of the completed semiconductor chips 210. In this embodiment, all of the grooves 240 are shaped to have perpendicular (straight-down) cross sections taken on a vertical plane at least in a range of depth corresponding to the thickness of the completed semiconductor chips 210. Next, as shown in FIG. 6C, an opaque resin layer 218 is formed over the semiconductor wafer "W", having the grooves 240, entirely.

Figure 6D:
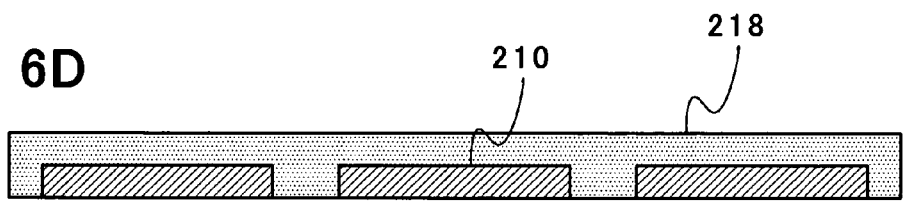
Figure 6E:
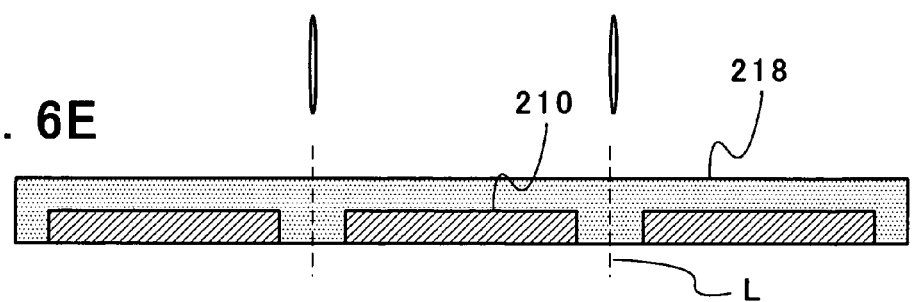
Figure 6F:
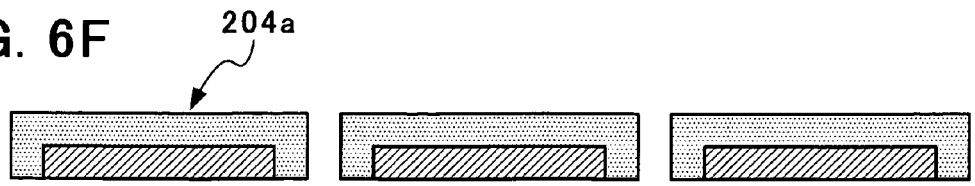

Next, as shown in FIG. 6D, a bottom or rear surface of the semiconductor wafer "W", which is not covered with the opaque resin layer 218, is ground up to bottom surfaces of the semiconductor chips 210. Next, as shown in FIG. 6E, the opaque resin layer 218 is cut off along dicing lines "L" on the spaces 224 to form individual semiconductor chips 204a, covered with an opaque resin, as shown in FIG. 6F. After that, thus fabricated semiconductor chips 204a are mounted on a semiconductor interposer 102 to complete a semiconductor package 200, shown in FIG. 4A. The semiconductor package 200 is mounted on a mount board, for example, a mother board using solder terminals 106.

Figure 7A:
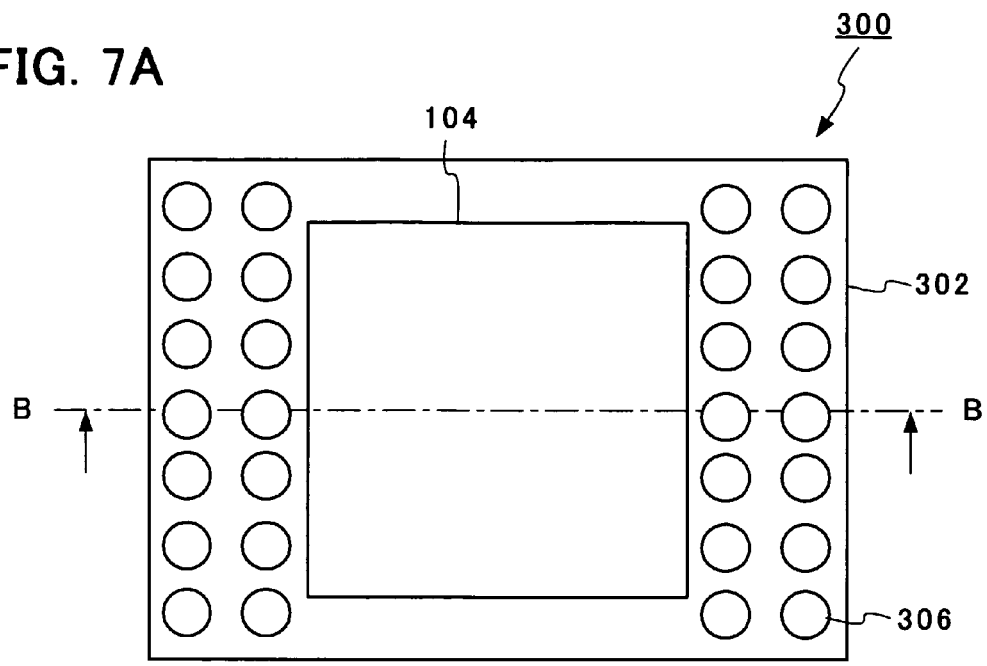
FIG. 7A is a plane view illustrating a semiconductor package, viewed from a semiconductor chip side, according to a third preferred embodiment of this invention.
Figure 7B:
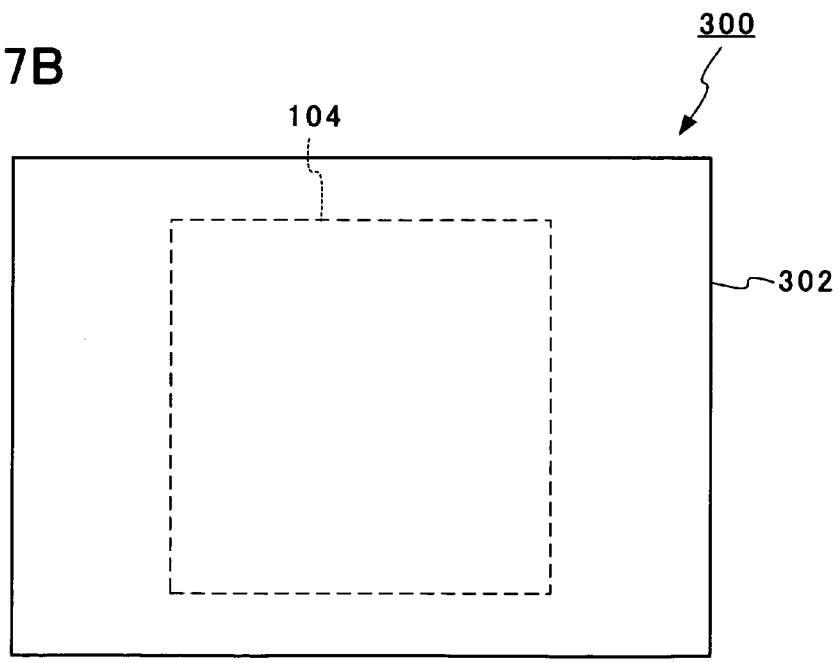
FIG. 7B is a plane view (bottom view) illustrating a semiconductor package, viewed from a semiconductor interposer side, according to the third preferred embodiment of this invention.
Figure 8:
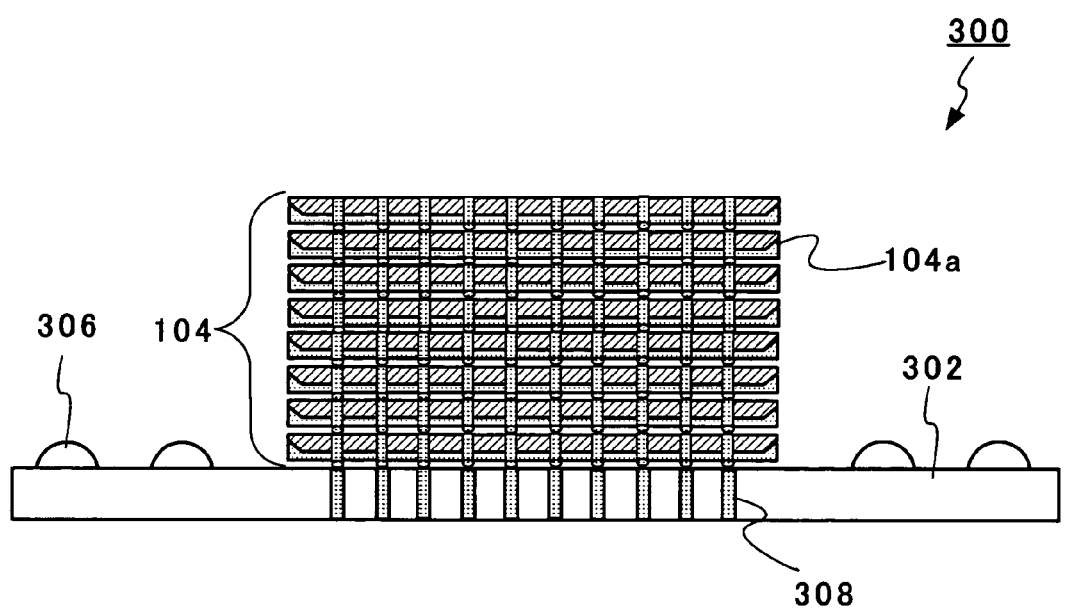
FIG. 8 is a cross-sectional view taken on line B-B in FIG. 7A.

FIG. 7A is a plane view illustrating a semiconductor package 300, viewed from a semiconductor chip side, according to a third preferred embodiment of this invention. FIG. 7B is a plane view (bottom view) illustrating a semiconductor package 300, viewed from a semiconductor interposer side, according to the third preferred embodiment of this invention. FIG. 8 is a cross-sectional view taken on line B-B in FIG. 7A. Now, a third preferred embodiment is described. In FIGS. 7A, 7B and 8, the same or corresponding components to those in the first and second preferred embodiments are represented by the same reference numerals, and the same description is not repeated. The differences from the first preferred embodiment are a structure of a semiconductor interposer 302 and a method for mounting a semiconductor package on a mother board.

A semiconductor package (apparatus) 300 includes a semiconductor interposer 302; a multi-layered semiconductor chip structure 104 mounted on the semiconductor interposer 302; a plurality of solder terminals 306 provided on a front or upper surface of the semiconductor interposer 302. The semiconductor interposer 302 is provided with a plurality of through electrodes 308, arranged to be face or opposing to through electrodes of the semiconductor chip 104a layered at the bottom.

Figure 9:
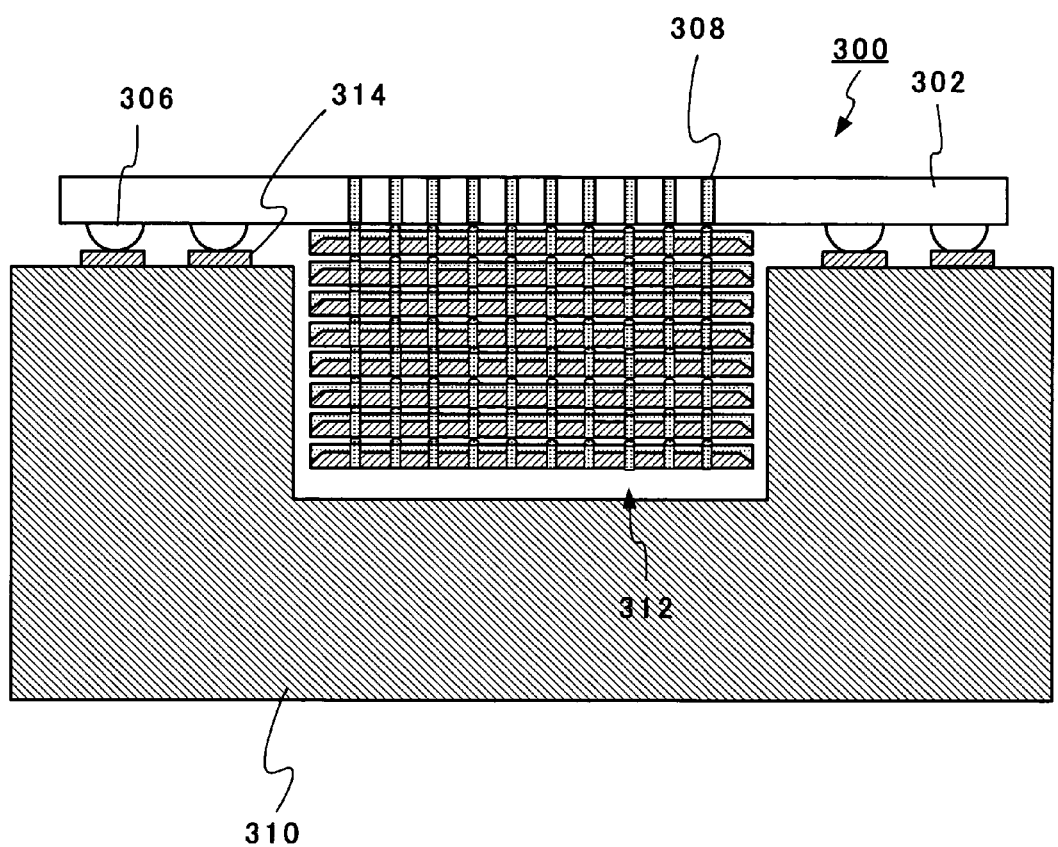
FIG. 9 is a cross-sectional view illustrating a semiconductor package according to the third preferred embodiment, shown in FIG. 8, mounted on a mount board.

FIG. 9 is a cross-sectional view illustrating the semiconductor package 300 mounted on a mount board (mother board) 310. According to this embodiment, the semiconductor package 300 is mounted on the mother board 310 so that the multi-layered semiconductor chip structure 104 faces down, which is the opposite direction to the first and second preferred embodiment.

The mother board 310 includes a hollow portion (concavity) 312, in which the semiconductor package 300 is mounted, and electrode pads 314 to be connected to the solder terminals 306, formed on the semiconductor interposer 302. According to such a structure, shown in FIG. 9, a height of the semiconductor package 300 mounted on a mother board can be reduced.

Figure 10:
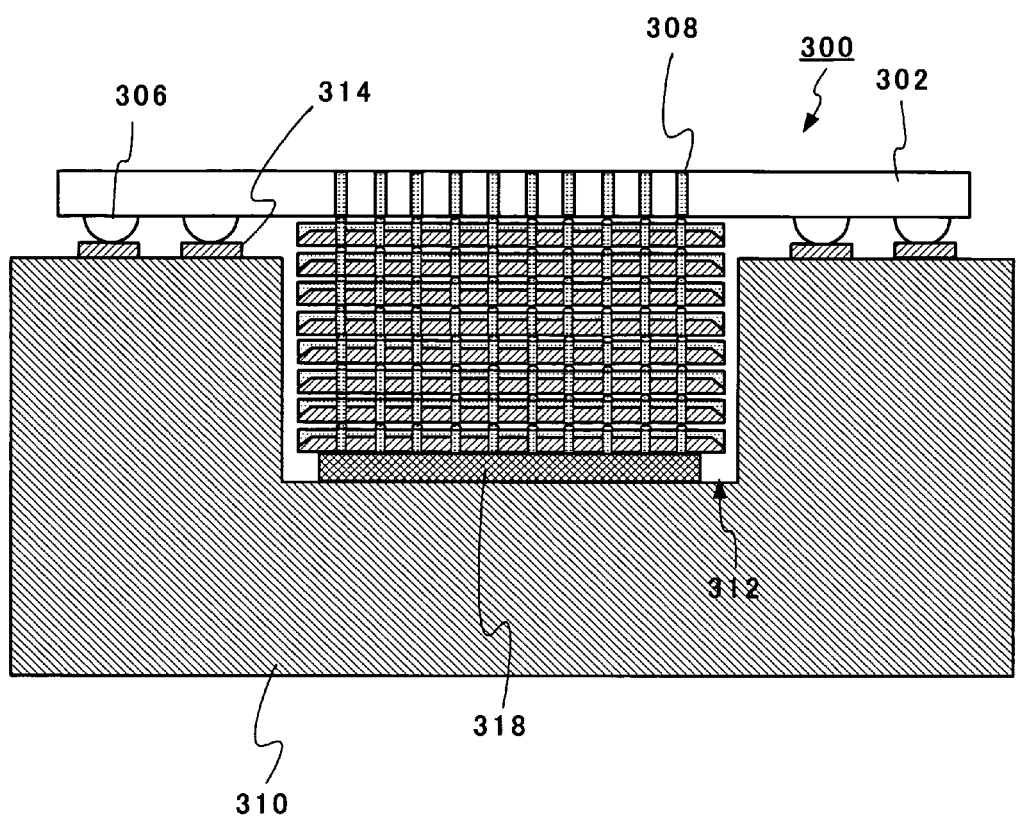
FIG. 10 is a cross-sectional view illustrating a semiconductor package, according to the third preferred embodiment, mounted on a mount board in another manner.

FIG. 10 is a cross-sectional view illustrating a semiconductor package 300 mounted on a mother board 310 in another manner. A metal resin layer 318, having a high thermal conductivity, is provided between a bottom of a hollow portion 312 of the mother board 310 and a multi-layered semiconductor chip structure 104. According to the structure, shown in FIG. 10, heat, generated in semiconductor chips 104a, is transferred efficiently, so that malfunction of devices could be prevented. In stead of the metal resin layer 318, a silver paste or a metal film may be used.

Figure 11:
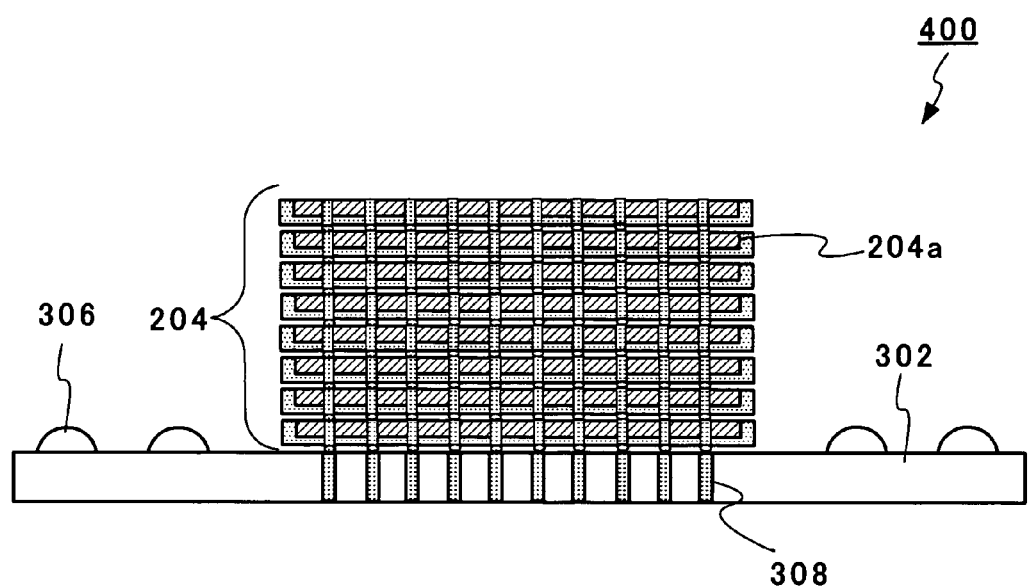
FIG. 11 is a cross-sectional view illustrating a semiconductor package according to a fourth preferred embodiment of this invention.

FIG. 11 is a cross-sectional view illustrating a semiconductor package 400 according to a fourth preferred embodiment of this invention. In FIG. 11, the same or corresponding components to those in the first to third preferred embodiments are represented by the same reference numerals, and the same description is not repeated. This fourth preferred embodiment is formed by combining technology of the second and third preferred embodiments. That is, a multi-layered semiconductor chip structure 204, according to the second preferred embodiment, is mounted on a semiconductor interposer 302, according to the third preferred embodiment. The semiconductor package 400 may be mounted on the mother board in the same manner as the third preferred embodiment.

What is claimed is:
1. A semiconductor package, comprising:
 a semiconductor interposer;
 a plurality of semiconductor chips mounted on the semiconductor interposer, each chip having through electrodes,
 wherein each of the semiconductor chips includes:
   a semiconductor substrate shaped to have a beveling portion at its peripheral corner;
   a wiring layer formed on the semiconductor substrate;
   an opaque resin layer formed on a surface of the beveling portion, the opaque resin layer sealing the wiring layer; and
   conductive bumps to be connected to the through electrodes.

2. A semiconductor package according to claim 1, wherein:
a side surface of the semiconductor substrate and a side surface of the opaque resin layer continuously abut to each other, and collectively form a side surface of the semiconductor chip; and
the opaque resin layer has a uniform thickness at its entire side surface.

3. A semiconductor package according to claim 1, wherein the semiconductor chips are memory chips.

4. A semiconductor package according to claim 1, wherein:
the semiconductor interposer has first and second surfaces, which are opposite to each other;
the plurality of semiconductor chips are mounted on the first surface of the semiconductor interposer;
a plurality of solder terminals are formed on the second surface of the semiconductor interposer; and the plurality of solder terminals are to be connected electrically to a mount board.

5. A semiconductor package according to claim 1, wherein:
the semiconductor interposer has first and second surfaces, which are opposite to each other;
the plurality of semiconductor chips are mounted on the first surface of the semiconductor interposer;
a plurality of solder terminals are formed on the first surface of the semiconductor interposer;
the plurality of solder terminals are to be connected electrically to a mount board;
the mount board is shaped to have a hollow portion, in which the semiconductor package is contained; and
the semiconductor package is mounted in the hollow portion of the mount board so that the semiconductor interposer faces up.

6. A semiconductor package according to claim 5, wherein a heat radiating member, having a high thermal conductivity, is arranged between a bottom of the hollow portion and the semiconductor package.

7. A semiconductor package according to claim 6, wherein the heat radiating member is of a metal resin.

8. The semiconductor package according to claim 1, further comprising a metal solder disposed between a first one of the semiconductor chips and a second one of the semiconductor chips that is disposed directly under the first semiconductor chip, and wherein:
each conductive bump of the first semiconductor chip penetrates the opaque resin layer in a thickness direction of the opaque resin layer, one end of the bump being connected to the through electrode of the first semiconductor chip, the other end of the bump being connected to a metal solder, the metal solder being connected to the through electrode of the second semiconductor chip.

9. A semiconductor package, comprising:
a semiconductor interposer;
a plurality of semiconductor chips mounted on the semiconductor interposer, each semiconductor chip having through electrodes,
wherein each semiconductor chip includes:
a semiconductor substrate having an upper surface and a side surface;
a wiring layer formed on the upper surface of the semiconductor substrate;
an opaque resin layer covering the upper surface and the side surface of the semiconductor substrate, so that a side surface of the opaque resin layer forms a side surface of each semiconductor chip; and
conductive bumps connected to the through electrodes.

10. The semiconductor package according to claim 9, wherein the entire side surface of the opaque resin layer has a uniform height.

11. The semiconductor package according to claim 9, further comprising a metal solder disposed between a first one of the semiconductor chips and a second one of the semiconductor chips that is disposed directly under the first semiconductor chip, and wherein:
each conductive bump of the first semiconductor chip penetrates the opaque resin layer in a thickness direction of the opaque resin layer, one end of the bump being connected to the through electrode of the first semiconductor chip, the other end of the bump being connected to a metal solder, the metal solder being connected to the through electrode of the second semiconductor chip.

* * * * *